(12) United States Patent
Jones

(10) Patent No.: US 11,526,152 B2
(45) Date of Patent: *Dec. 13, 2022

(54) TECHNIQUES FOR DETERMINING FABRICABILITY OF DESIGNS BY SEARCHING FOR FORBIDDEN PATTERNS

(71) Applicant: X Development LLC, Mountain View, CA (US)

(72) Inventor: Albin Lee Jones, Half Moon Bay, CA (US)

(73) Assignee: X DEVELOPMENT LLC, Mountain View, CA (US)

( * ) Notice: Subject to any disclaimer, the term of this patent is extended or adjusted under 35 U.S.C. 154(b) by 381 days.

This patent is subject to a terminal disclaimer.

(21) Appl. No.: 16/721,589

(22) Filed: Dec. 19, 2019

(65) Prior Publication Data

US 2021/0191360 A1    Jun. 24, 2021

(51) Int. Cl.
*G05B 19/4099* (2006.01)
*G06F 17/14* (2006.01)
(Continued)

(52) U.S. Cl.
CPC ........ *G05B 19/4099* (2013.01); *B29C 64/386* (2017.08); *B33Y 50/00* (2014.12);
(Continued)

(58) Field of Classification Search
CPC ...... G05B 19/4099; G05B 2219/35134; G05B 2219/35305; G05B 2219/49007;
(Continued)

(56) References Cited

U.S. PATENT DOCUMENTS

| 5,865,978 A | 2/1999 | Cohen |
| 2006/0088200 A1 | 4/2006 | Du et al. |

(Continued)

FOREIGN PATENT DOCUMENTS

| JP | 2006208340 A | * | 8/2006 | |
| JP | 4002655 B2 | * | 11/2007 | ............. G06T 5/006 |

(Continued)

OTHER PUBLICATIONS

15. Andrea Crespi et al. Suppression law of quantum states in a 3D photonic fast Fourier transform chip; Nature Communications, Feb. 4, 2016 (Year: 2016).*

(Continued)

*Primary Examiner* — Chad G Erdman
(74) *Attorney, Agent, or Firm* — Christensen O'Connor Johnson Kindness PLLC

(57) ABSTRACT

In some embodiments, techniques are provided for verifying that a fabrication system can fabricate a proposed segmented design. A paintbrush pattern that represents capabilities of the fabrication system is determined. One or more forbidden patterns that the fabrication system is not capable of fabricating are determined based on the paintbrush pattern. The proposed segmented design is then searched for the forbidden patterns. If any forbidden patterns are found, the proposed segmented design is determined to not be fabricable by the fabrication system. If no forbidden patterns are found, then the proposed segmented design is determined to be fabricable by the fabrication system.

18 Claims, 13 Drawing Sheets

(51) Int. Cl.
  *B33Y 50/00*  (2015.01)
  *B29C 64/386*  (2017.01)
  *G06F 30/20*  (2020.01)

(52) U.S. Cl.
  CPC ............ *G06F 17/141* (2013.01); *G06F 30/20* (2020.01); *G05B 2219/35134* (2013.01); *G05B 2219/35305* (2013.01); *G05B 2219/49007* (2013.01)

(58) Field of Classification Search
  CPC ... G05B 19/4093; B29C 64/386; B33Y 50/00; G06F 17/141; G06F 30/30; G06F 30/20; Y02P 90/02
  See application file for complete search history.

(56) References Cited

U.S. PATENT DOCUMENTS

| | | |
|---|---|---|
| 2016/0253450 A1 | 9/2016 | Kandel et al. |
| 2017/0337673 A1* | 11/2017 | Tseng ...................... G06T 7/001 |
| 2018/0011398 A1 | 1/2018 | Tel et al. |
| 2019/0073442 A1 | 3/2019 | Gold et al. |
| 2019/0163866 A1 | 5/2019 | Liu et al. |
| 2020/0026819 A1* | 1/2020 | Leu ........................ G06F 30/398 |
| 2020/0371493 A1 | 11/2020 | Uzawa et al. |

FOREIGN PATENT DOCUMENTS

| | | | |
|---|---|---|---|
| KR | 2009/0115230 A | | 4/2009 |
| KR | 20130055014 A | * | 5/2013 |
| KR | 20170031730 A | | 3/2017 |
| WO | 2019151519 A1 | | 8/2019 |

OTHER PUBLICATIONS

International Search Report and Written Opinion, dated Feb. 18, 2021, in corresponding International Patent Application No. PCT/US2020/058292, 9 pages.

Badr, Y., et al., "Layout pattern-driven design rule evaluation," Journal of Micro/Nanolithography, MEMS, and MOEMS, 13(4), Oct.-Dec. 2014, 10 pages.

* cited by examiner

TECHNIQUES FOR DETERMINING FABRICABILITY OF DESIGNS BY SEARCHING FOR FORBIDDEN PATTERNS

TECHNICAL FIELD

This disclosure relates generally to designing devices, and in particular but not exclusively, relates to verifying fabricability of device designs.

BACKGROUND

Optical and electromagnetic devices are devices that create, manipulate, propagate, and/or measure electromagnetic radiation. Their applications vary broadly and include, but are not limited to, acousto-optic modulators, optical modulators, optical ring resonators, distributed Bragg reflectors, lasers, lenses, transistors, waveguides, antennas, and the like. Design of these devices is sometimes determined through a simple guess and check method in which a small number of design parameters of a pre-determined design are adjusted for suitability to a particular application. However, in actuality, these devices may have design parameters ranging from hundreds all the way to many billions, dependent on the device size and functionality. As functionality of these optical and electromagnetic devices is increased and manufacturing improves to allow for smaller device feature sizes, it becomes increasingly important to take full advantage of these improvements via optimized device design.

Though some techniques for generating device designs exist, some of these techniques simply generate device designs without considering whether the generated designs can be fabricated. A need exists for techniques for measuring and verifying the fabricability of device designs.

SUMMARY

In some embodiments, a method of verifying fabricability of a segmented design for a physical device to be fabricated by a fabrication system is provided. A proposed segmented design is received. The proposed segmented design is searched for forbidden patterns of a set of forbidden patterns. A fabricability score for the proposed segmented design is designed based on whether the one or more forbidden patterns were found in the design.

In some embodiments, a non-transitory computer-readable storage medium is provided. The storage medium has instructions stored thereon that, in response to execution by one or more processors of a computing system, cause the computing system to perform actions comprising: receiving a proposed segmented design; searching the proposed segmented design for forbidden patterns of a set of forbidden patterns; and determining a fabricability score for the proposed segmented design based on whether the one or more forbidden patterns were found in the design.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1:
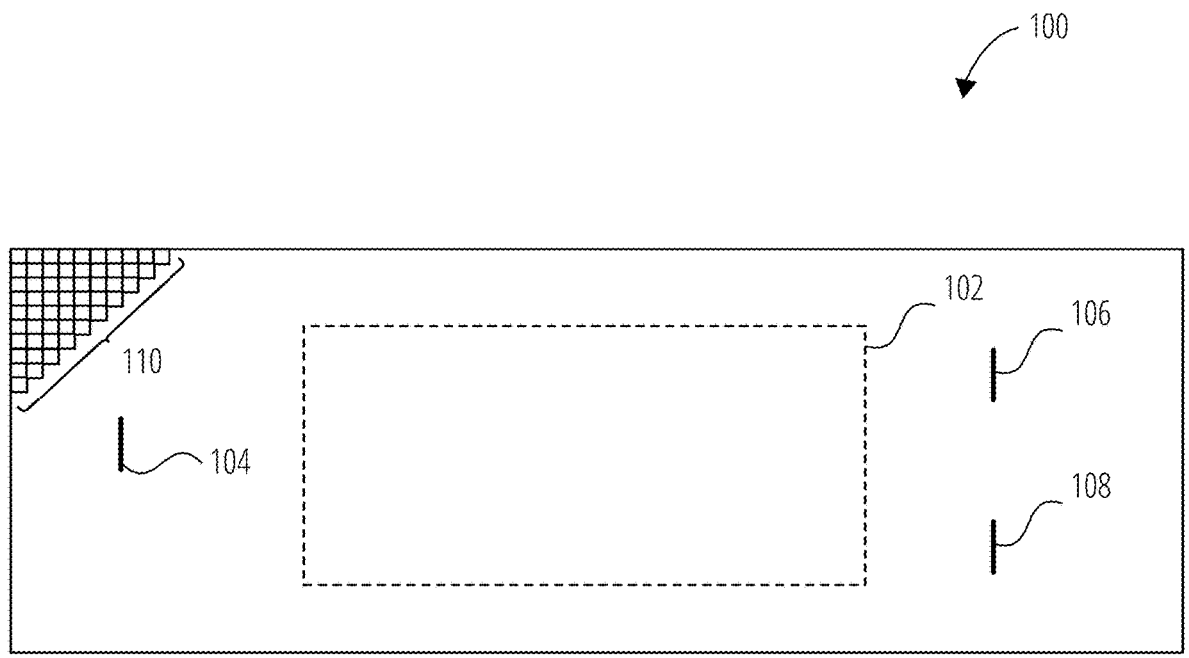
FIG. 1 illustrates an example rendering of a non-limiting example of a simulated environment 100 describing an electromagnetic device according to various aspects of the present disclosure.
Figure 2:
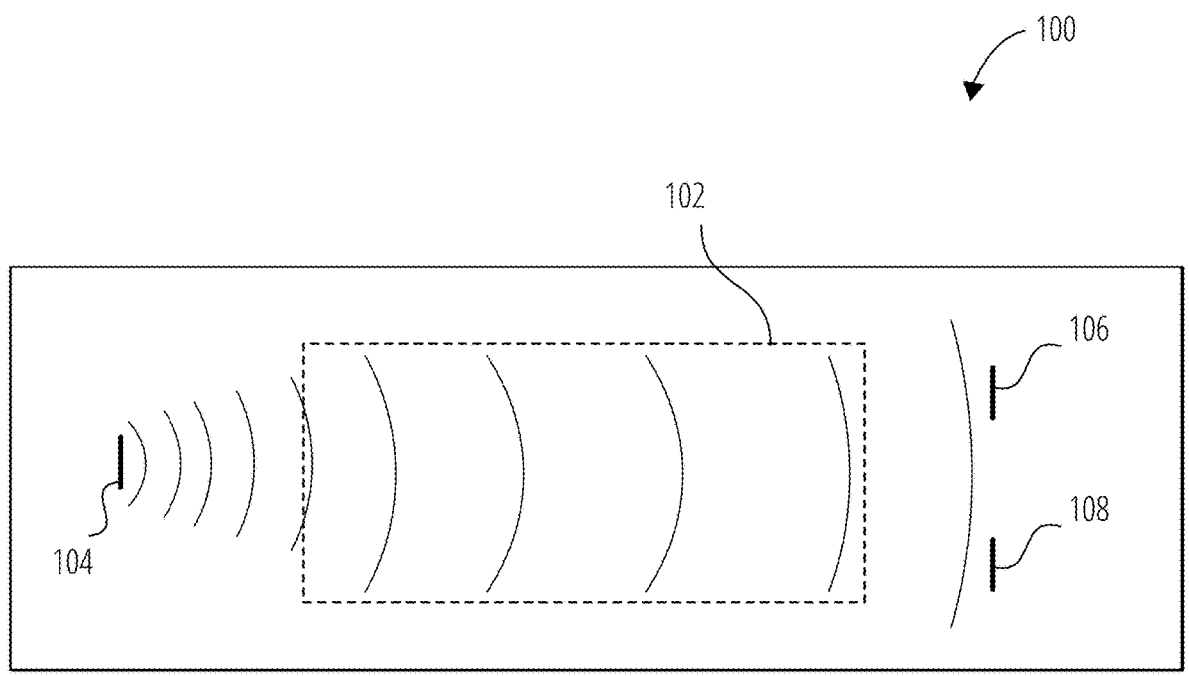
FIG. 2 illustrates a non-limiting example embodiment of a time-forward simulation of the simulated environment describing the electromagnetic device, according to various aspects of the present disclosure.

FIG. 1 and FIG. 2 illustrate an initial set up and a time-forward simulation of a simulated environment for optimizing structural parameters of an electromagnetic device according to various aspects of the present disclosure. The simulated environment 100 may be used to evaluate performance characteristics of a proposed design for the electromagnetic device.

In the following embodiments, the simulated environment 100 will be described in the context of an optical waveguide as corresponding to the electromagnetic device. However, it is appreciated that the electromagnetic device is not limited to optical waveguides, and that other electromagnetic devices such as lasers, lenses, transistors, optical devices, quantum-dynamic devices, antennas, optoelectronic switches, mechanical structures, and the like may be represented by the term "electromagnetic device." Likewise, though an electromagnetic device is an example of a type of device for which the fabricability of a proposed segmented design may be evaluated using embodiments of the present disclosure, embodiments of the present disclosure are not limited to working with designs for an electromagnetic device. Instead, embodiments of the present disclosure may be used to measure and/or validate the fabricability of a proposed segmented design for any type of device.

A segmented design, as used herein, is a design that is defined by a configuration of a plurality of segments. In some embodiments, the segmented design may be a two-dimensional design, wherein the segments are squares arranged in a two-dimensional grid pattern. In some embodiments, the segmented design may be a three-dimensional design, wherein the segments are cubes arranged in a three-dimensional grid pattern. These embodiments are non-limiting examples only, and in other embodiments, the segments may be any other shape, and/or may be laid out in any other pattern. In some embodiments, the segments of a given segmented design may be of heterogenous shapes and/or sizes.

The simulated environment 100 and corresponding initial set up and time-forward simulation may be achieved via a physics simulator. As illustrated in FIG. 1 and FIG. 2, the simulated environment 100 is represented in two-dimensions. However, it is appreciated that higher (e.g., 3-dimensional space) and lower (e.g., 1-dimensional space) dimensionality may also be used to describe the simulated environment 100 and electromagnetic device.

FIG. 1 illustrates an example rendering of a non-limiting example of a simulated environment 100 describing an electromagnetic device according to various aspects of the present disclosure. The simulated environment 100 represents the simulated environment 100 at an initial time step (e.g., an initial set up) for optimizing structural parameters of the electromagnetic device. The electromagnetic device described by the simulated environment 100 may correspond to an optical waveguide having a designable region 102 in which the structural parameters of the simulated environment may be designed, modified, or otherwise changed. The simulated environment 100 includes an excitation source 104 (e.g., a gaussian pulse, a wave, a waveguide mode response, and the like). The electrical and magnetic fields within the simulated environment 100 (and subsequently the electromagnetic device) may change (e.g., field response) in response to the excitation source 104. The electromagnetic device includes a first waveguide output port 106 and a second waveguide output port 108, which may be used for determining a performance parameter or metric of the electromagnetic device in response to the excitation source 104.

As illustrated, the simulated environment 100 (and subsequently the electromagnetic device) is described by a plurality of segments 110, which represent individual elements of the two-dimensional (or three-dimensional) space of the simulated environment. Each of the segments 110 is illustrated in FIG. 1 as two-dimensional squares, however it is appreciated that the segments 110 may be represented as cubes or other shapes in three-dimensional space, or shapes other than squares in a two-dimensional environment. It is appreciated that the specific shape and dimensionality of the plurality of segments 110 may be adjusted dependent on the simulated environment 100. It is further noted that only a portion of the plurality of segments 110 are illustrated to avoid obscuring other aspects of the simulated environment 100.

For simulation purposes, each of the plurality of segments 110 may be associated with at least a structural value to describe the structural parameters, a field value to describe a field response, and a source value to describe the excitation source at a specific position within the simulated environment 100. The field response, for example, may correspond to a vector describing the electric and/or magnetic field at a particular time step for each of the plurality of segments 110. More specifically, the vector may correspond to a Yee lattice to discretize Maxwell's equations for determining the field response. In some embodiments, the field response is based, at least in part, on the structural parameters and the excitation source 104. For design purposes, each of the plurality of segments 110 may be associated with the presence or absence of a material. The material may be deposited or removed during manufacture using a photolithography system, an additive manufacturing system, or any other suitable type of fabrication system.

FIG. 2 illustrates a non-limiting example embodiment of a time-forward simulation of the simulated environment 100 describing the electromagnetic device, according to various aspects of the present disclosure. The rendered simulated environment 100 represents the time-forward simulation at a particular time step in which the excitation source 104 is active (e.g., generating waves originating at the excitation source 104 that propagate through the simulated environment 100). In some embodiments, the electromagnetic device is an optical waveguide operating at a frequency of interest and having a particular waveguide mode (e.g., transverse electromagnetic mode, transverse electric mode, etc.) and the excitation source is at an input of the optical waveguide having a specified spatial, phase, and temporal profile. The time-forward simulation occurs over a plurality of time steps, including the illustrated time step. When performing the time-forward simulation, changes to the field response (e.g., the field value) for each of the plurality of segments 110 are updated in response to the excitation source 104 and based, at least in part, on the structural parameters of the electromagnetic device at each of the plurality of time steps. Similarly, in some embodiments the source value is updated for each of the plurality of segments 110 (e.g., in response to the electromagnetic waves from the excitation source 104 propagating through the simulated environment 100). It is appreciated that the time-forward simulation is incremental and that the field value (and source value) is updated incrementally at each time step as time moves forward for each of the plurality of time steps. It is further noted that in some embodiments, the update is an iterative process and that the update of each field and source value is based, at least in part, on the previous update of each field and source value.

When performing the time-forward simulation, decomposition components from the field response associated with a performance parameter of the electromagnetic device are extracted. In some embodiments, the performance parameter corresponds to the amount of a desired output mode of the first waveguide output port 106 and the second waveguide output port 108. Extracting the decomposition components may correspond to extracting Fourier components of the performance parameter as a function of time. The performance parameter represents power (at one or more frequencies of interest) in the desired mode shape at the specific locations of the first waveguide output port 106 and the second waveguide output port 108. A loss value may subsequently be computed based, at least in part, on a difference between the performance parameter at a time step (e.g. a final time step of the time-forward simulation) and a desired performance value. The loss value may be determined by a loss function which describes the relationship between the performance parameter and the desired performance value. In some embodiments, backpropagation may also be performed in the simulated environment 100, and the time-forward simulation and the backpropagation may be used to improve the performance of the simulated environment 100 by suggesting changes in a design in the designable region 102.

Figure 3:
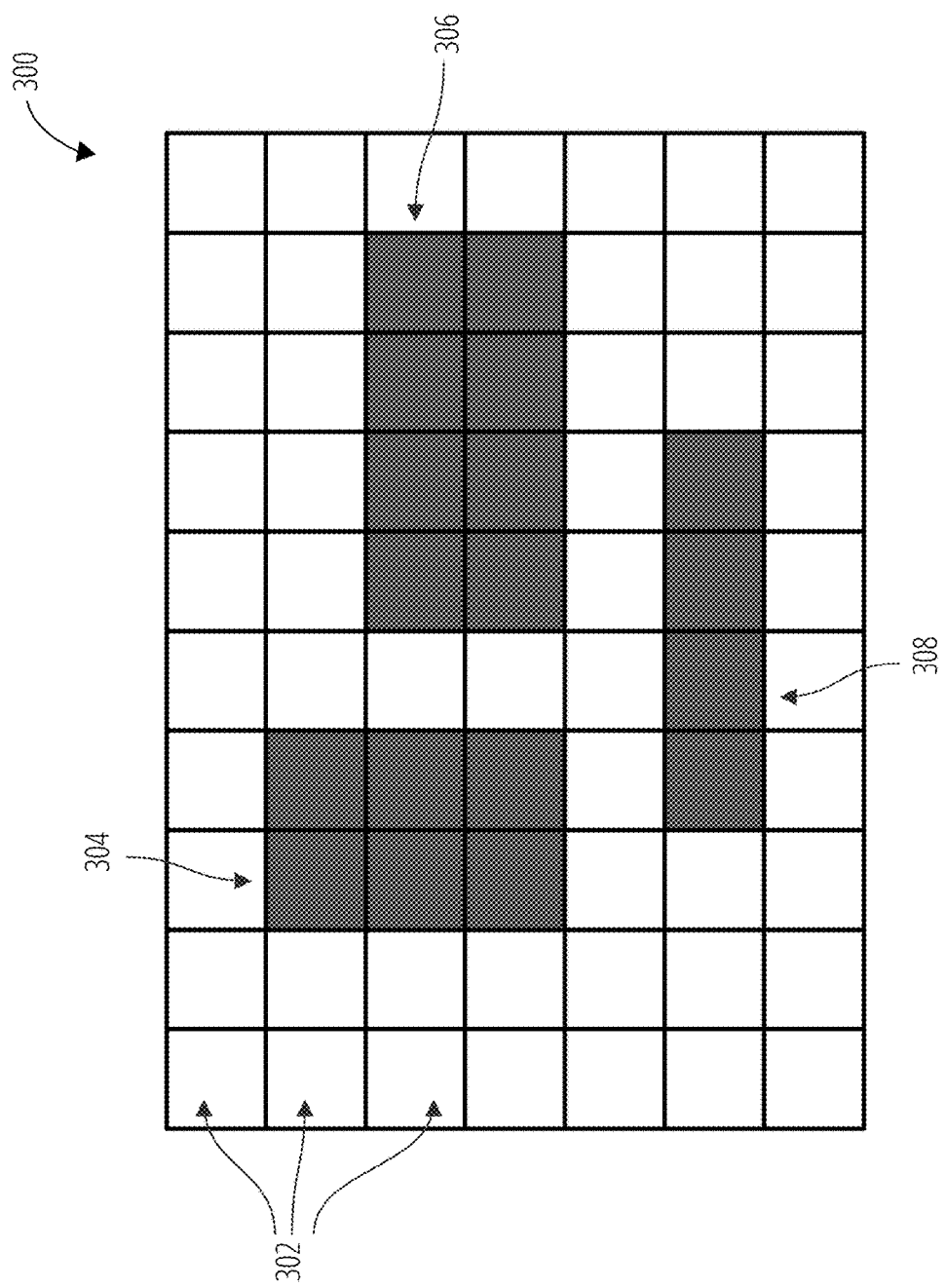
FIG. 3 is a schematic drawing that illustrates a non-limiting example embodiment of a segmented design according to various aspects of the present disclosure.

FIG. 3 is a schematic drawing that illustrates a non-limiting example embodiment of a segmented design according to various aspects of the present disclosure. The segmented design 300 is a non-limiting example of content suitable for insertion in the designable region 102 described above (though not drawn to the scale or with the same granularity of segmentation). As shown, the segmented design 300 includes a plurality of segments 302 laid out in a two-dimensional grid. Each of the segments 302 represents a location in the proposed segmented design that can either include a material or not include a material. As illustrated, segments that are white indicate a lack of the material, and segments that are dark (such as the first pattern 304, the second pattern 306, and the third pattern 308, indicate a presence of the material. For example, in a photolithography process, segments that are white may represent locations that are not exposed, and segments that are dark may represent locations that are exposed during the photolithography process. As another example, in an additive manufacturing process (e.g., a 3-D printer), segments that are white may represent locations that do not include material, and segments that are dark may represent locations that do include material.

This description is a non-limiting example only, and in some embodiments, the white and dark segments may have another meaning within the segmented design 300. In some embodiments, the segmented design 300 may include more than two colors. For example, a white segment may indicate a lack of material, a segment in a first color may indicate presence of a first material, and a segment in a second color may indicate a presence of a second material. In some embodiments, the segmented design 300 may be three-dimensional or one-dimensional, instead of the two-dimensional segmented design 300 illustrated in FIG. 3.

Typically, a fabrication system can duplicate any segmented design provided to it, subject to certain constraints. For example, a minimum feature size, a minimum feature shape, or any other constraint may be specified by the fabrication system as limitations on the segmented designs that the fabrication system can fabricate. From these constraints, a "paintbrush pattern" can be determined. In some embodiments, the paintbrush pattern represents a smallest feature that can be generated by a given fabrication system. If a given segmented design can be created by tiling the paintbrush pattern over the segmented design, then the segmented design is fabricable using the associated fabrication system. If one or more portions of the segmented design cannot be drawn with the paintbrush pattern, then the segmented design is not fabricable using the associated fabrication system. In some embodiments, if a fabrication system can fabricate devices with more than one material, separate constraints (and therefore separate paintbrush patterns) may be provided for each different material.

Figure 4:
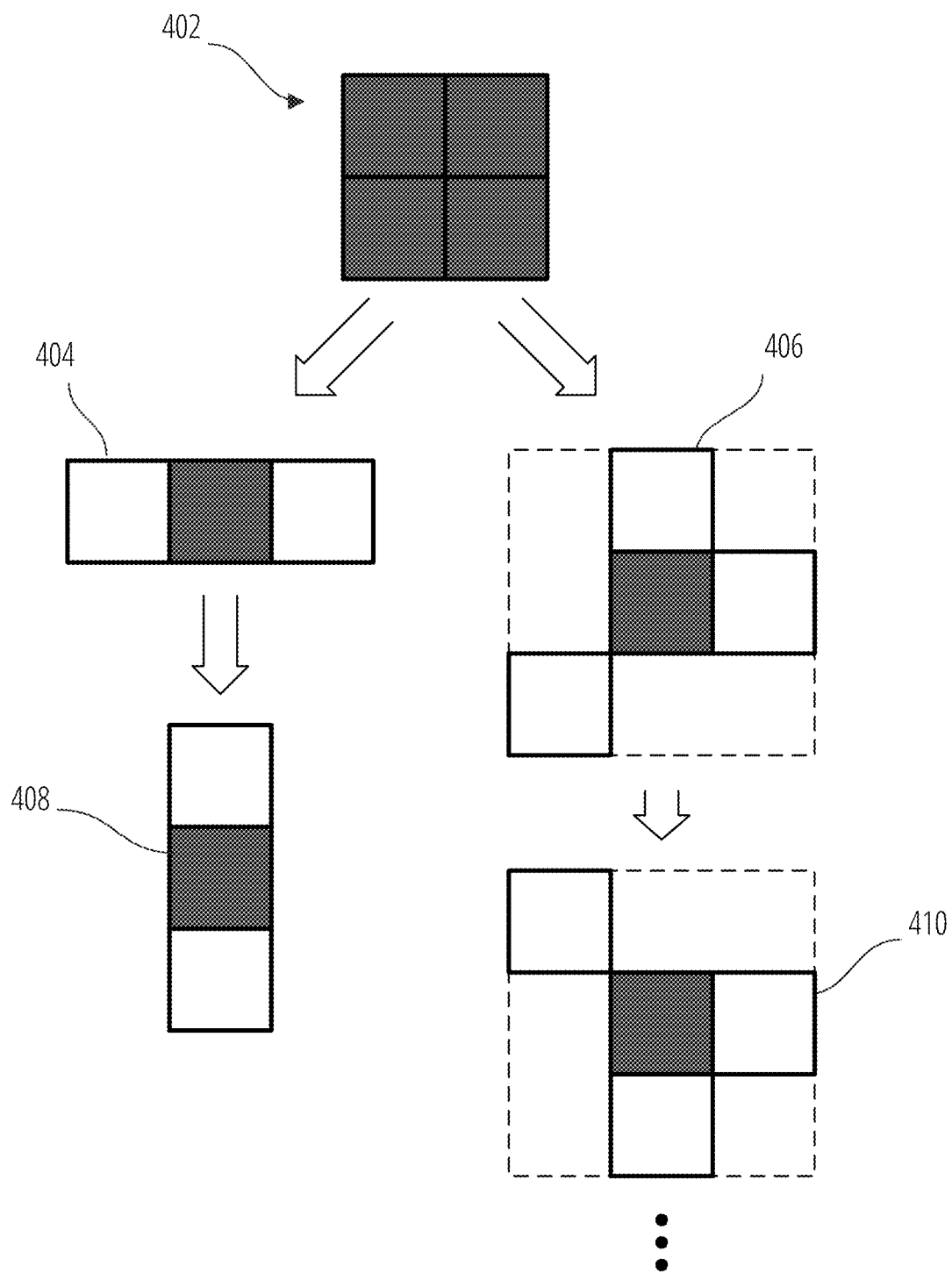
FIG. 4 is a schematic drawing that illustrates a non-limiting example embodiment of a paintbrush pattern and other associated patterns according to various aspects of the present disclosure.

FIG. 4 is a schematic drawing that illustrates a non-limiting example embodiment of a paintbrush pattern and other associated patterns according to various aspects of the present disclosure. As shown the paintbrush pattern 402 is a representation of constraints provided by a given fabrication system in which the minimum feature size is two segments by two segments, arranged in a square shape. In order to determine fabricability of a given segmented design, the paintbrush pattern 402 could be drawn over the segmented design in order to determine if each pattern can be drawn using the paintbrush pattern 402. In FIG. 3, the first pattern 304 and the second pattern 306 can be drawn by the paintbrush pattern 402, because they are both at least two segments wide or tall. The third pattern 308, however, is only one segment tall, and therefore cannot be drawn by the paintbrush pattern 402. Accordingly, the segmented design 300 of FIG. 3 is not fabricable using the fabrication system represented by the paintbrush pattern 402.

One way to perform the paintbrush analysis described above is to consider each of the first pattern 304, the second pattern 306, and the third pattern 308, and to determine whether a tiling of the paintbrush pattern 402 within each pattern is possible. Unfortunately, such a calculation tends to be intractable, particularly as the size of the segmented design 300 and/or the number of patterns to be drawn increases. What is desired are techniques to improve the efficiency of determining whether a segmented design can be drawn with a given paintbrush pattern, and to thereby determine whether the segmented design is fabricable.

In some embodiments of the present disclosure, the search for paintbrush patterns in the patterns of a segmented design is replaced by a search for forbidden patterns, which are patterns that are not possible to create with a given paintbrush pattern. Returning to FIG. 4, a first forbidden pattern 404 and a second forbidden pattern 406 based on the paintbrush pattern 402 are illustrated. Logically, the first forbidden pattern 404 is based on the idea that a two-by-two paintbrush pattern such as paintbrush pattern 402 can never paint a single segment surrounded on opposite sides by unpainted segments, because the paintbrush pattern 402 is too wide. The second forbidden pattern 406 is based on the idea that, if a given segment is painted and a segment above and an a segment to the right of the painted segment are unpainted, then a segment below and to the left of the painted segment cannot also be unpainted because the paintbrush pattern 402 would not fit between the unpainted segments. In the second forbidden pattern 406, the content of the dashed portions in the upper right corner, the upper left corner, and the lower right corner (e.g., the painted or unpainted state of those segments) are irrelevant, and so are illustrated in dashed lines.

Instead of separately determining every possible forbidden pattern, the first forbidden pattern 404 and the second forbidden pattern 406 may be augmented in order to determine all forbidden patterns to be searched for. In some embodiments, the forbidden patterns are rotated and flipped in order to cover all possible permutations of the forbidden patterns. As shown, the first forbidden pattern 404 is rotated to create a transformed first forbidden pattern 408. The first forbidden pattern 404 and the transformed first forbidden pattern 408 together cover all permutations of the first forbidden pattern 404. The second forbidden pattern 406 is rotated 90 degrees to create a transformed second forbidden pattern 410. Though omitted for the sake of brevity, the second forbidden pattern 406 may be rotated 180 degrees and 270 degrees to create additional transformed forbidden patterns and complete the set of forbidden patterns.

Once the complete set of forbidden patterns (the initial forbidden patterns plus the transformed forbidden patterns) is complete, the segmented design 300 can be searched for the forbidden patterns in order to determine whether the segmented design 300 is fabricable. Similar to the determination above, it would be found that segmented design 300 is not fabricable, at least because the third pattern 308 includes the transformed first forbidden pattern 408, the second forbidden pattern 406, and several transformed versions of the second forbidden pattern 406 (including but not limited to transformed second forbidden pattern 410).

Figure 5:
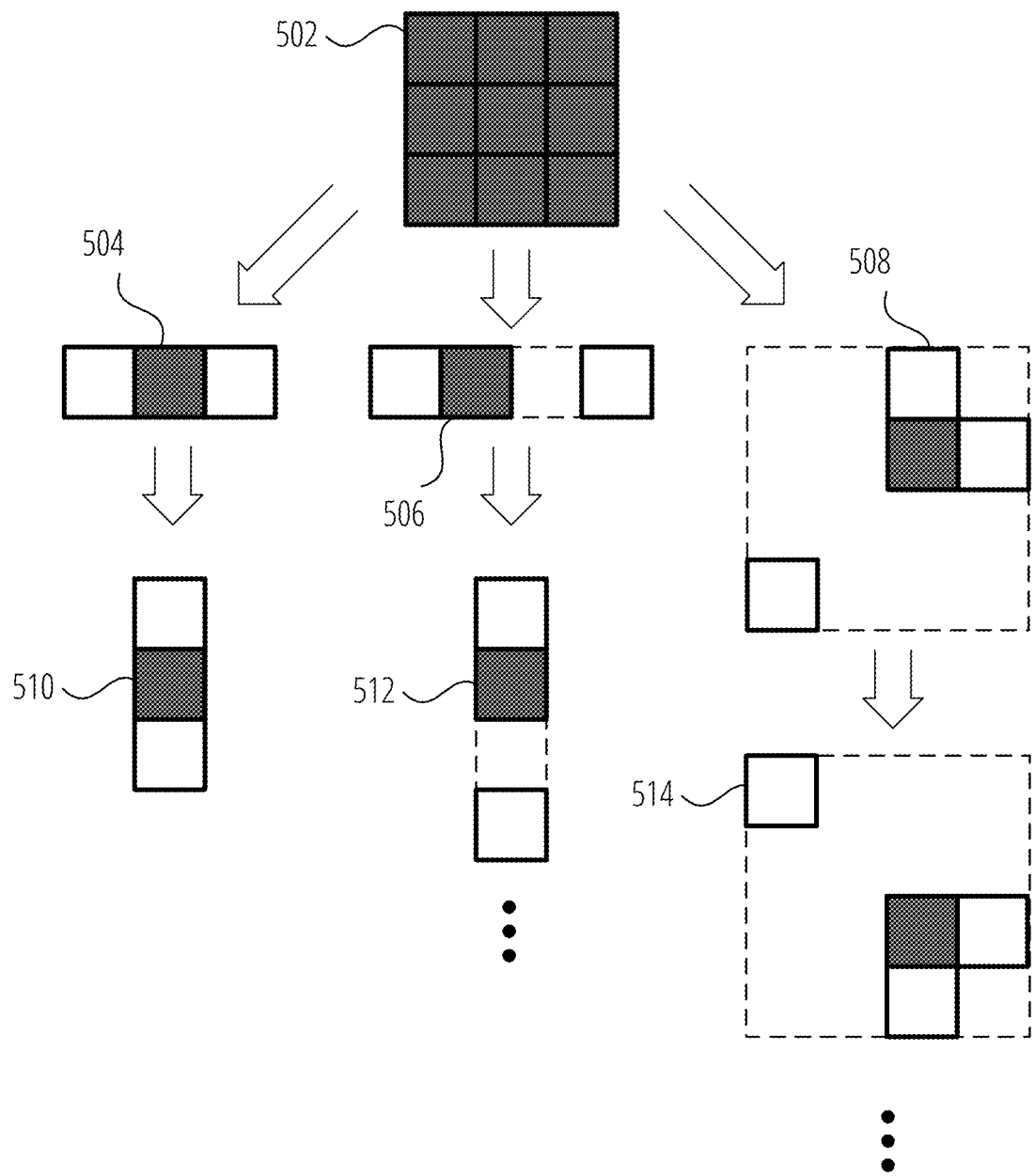
FIG. 5 is a schematic drawing that illustrates another non-limiting example embodiment of a paintbrush pattern and other associated patterns according to various aspects of the present disclosure.

The two-by-two paintbrush pattern 402 illustrated in FIG. 4 is a non-limiting example only. In some embodiments, the paintbrush pattern may be larger, smaller, or a different shape than the paintbrush pattern 402 illustrated in FIG. 4. FIG. 5 is a schematic drawing that illustrates another non-limiting example embodiment of a paintbrush pattern and other associated patterns according to various aspects of the present disclosure. The paintbrush pattern 502 is an example of a larger paintbrush pattern than the paintbrush pattern 402 illustrated in FIG. 4, in that it is three segments wide by three segments tall. As such, a different set of forbidden patterns is determined for the paintbrush pattern 502 than for the paintbrush pattern 402. A first forbidden pattern 504 is similar to the first forbidden pattern 404 illustrated in FIG. 4, because the paintbrush pattern 502 also cannot generate a pattern with a single painted segment between two unpainted segments. A second forbidden pattern 506 and a third forbidden pattern 508 are different, and reflect the larger size of the paintbrush pattern 502 in that there are larger patterns that are forbidden.

Once the first forbidden pattern 504, the second forbidden pattern 506, and the third forbidden pattern 508 are determined, they are transformed through rotations and flipping to create transformed forbidden patterns, such as transformed first forbidden pattern 510, transformed second forbidden pattern 512, and transformed third forbidden pattern 514. The full set of transformations of the second forbidden pattern 506 and the third forbidden pattern 508 are omitted for the sake of brevity.

Figure 6:
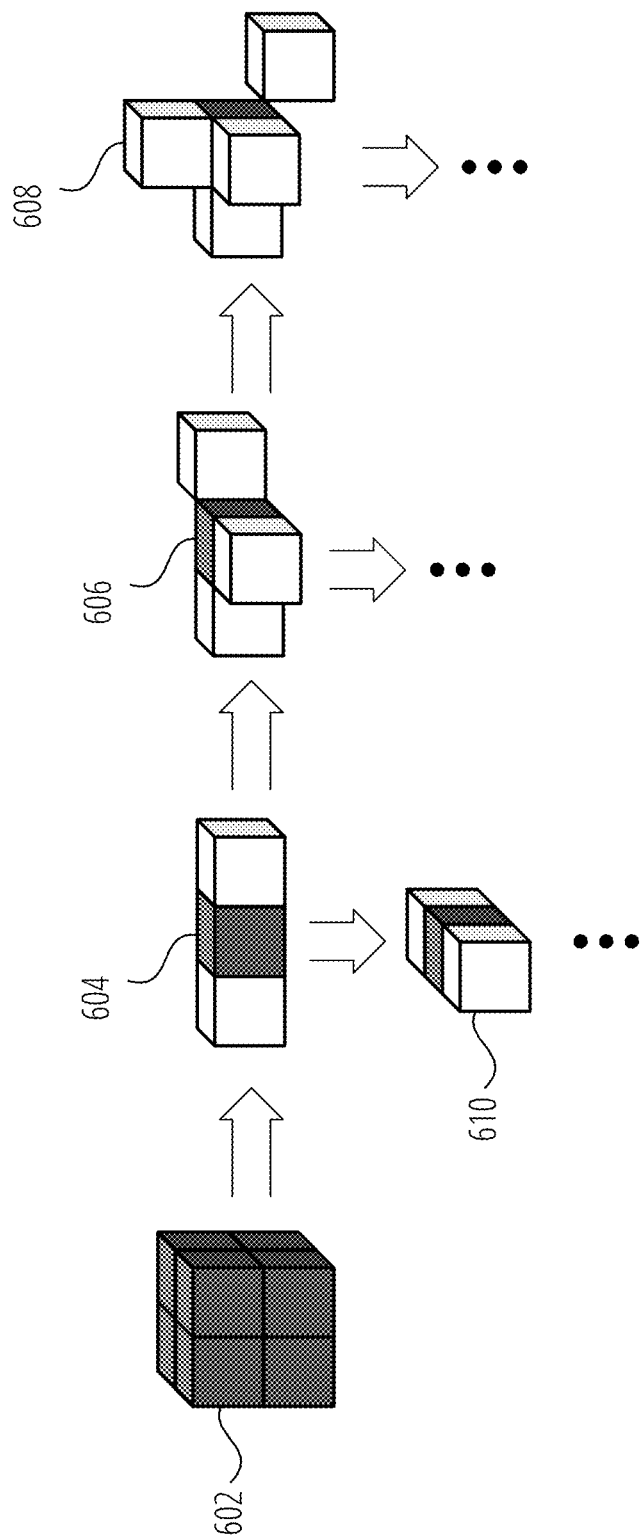
FIG. 6 is a schematic drawing that illustrates a non-limiting example embodiment of a three-dimensional paintbrush pattern and other associated patterns according to various aspects of the present disclosure.

FIG. 6 is a schematic drawing that illustrates a non-limiting example embodiment of a three-dimensional paintbrush pattern and other associated patterns according to various aspects of the present disclosure. As discussed above, embodiments of the present disclosure are not limited to processing two-dimensional designs, and so three-dimensional paintbrush patterns may be used to process three-dimensional designs. The three-dimensional paintbrush pattern 602 is two segments wide by two segments high by two segments deep. From this paintbrush pattern 602, a first forbidden pattern 604, a second forbidden pattern 606, and a third forbidden pattern 608 may be determined, which represent patterns that cannot be drawn with the paintbrush pattern 602. This set of paintbrush patterns may then be augmented by rotating each paintbrush pattern along each dimension, and flipping the paintbrush pattern along each dimension. In FIG. 6, a transformed first forbidden pattern 610 that is created by rotating the first forbidden pattern 604 along a vertical axis is illustrated, while the remainder of the rotated and flipped forbidden patterns are omitted for brevity.

Again, the specific paintbrush patterns and their corresponding forbidden patterns illustrated in FIG. 4 to FIG. 6 are non-limiting examples only. Though each of the illustrated forbidden patterns is symmetrical, in some embodiments, the paintbrush patterns may be asymmetrical along one or more dimensions.

Figure 7:
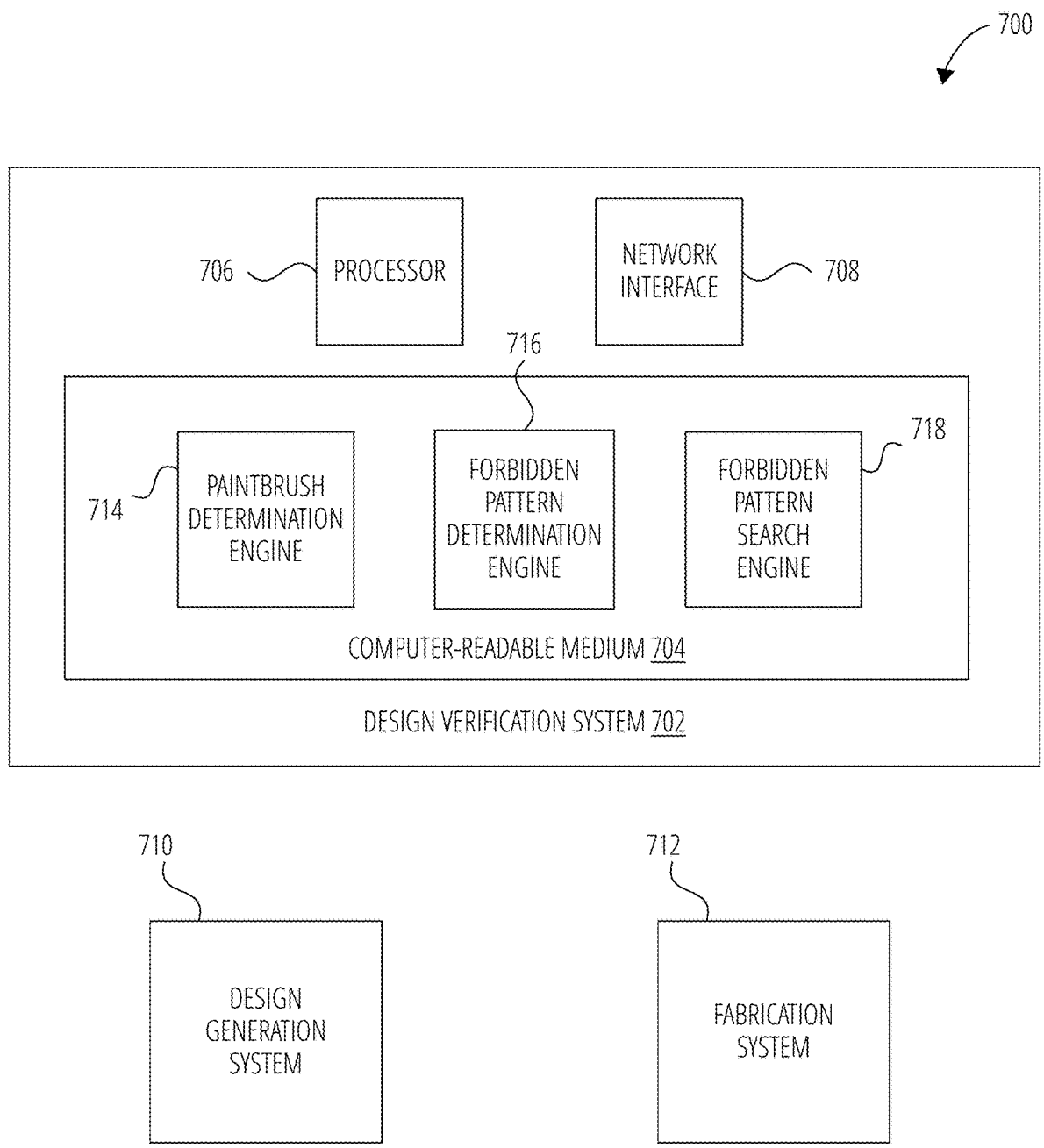
FIG. 7 is a block diagram that illustrates a non-limiting example embodiment of a system for verifying fabricability of a segmented design according to various aspects of the present disclosure.

FIG. 7 is a block diagram that illustrates a non-limiting example embodiment of a system for verifying fabricability of a segmented design according to various aspects of the present disclosure. The system 700 includes a design generation system 710, a design verification system 702, and a fabrication system 712. Communication between the design generation system 710, the design verification system 702, and the fabrication system 712 may occur via a network (not pictured), via exchange of a removable computer-readable medium (not pictured), or via any other suitable technique.

In some embodiments, the design generation system 710 may include one or more computing devices that are configured to generate segmented designs that achieve a desired result. For example, the design generation system 710 may use forward simulation and backpropagation techniques to generate a segmented design for an electromagnetic device that has desired characteristics. This is a non-limiting example only, and any other technique, including but not limited to manual design, may be used by the design generation system 710 to create proposed segmented designs.

In some embodiments, the fabrication system 712 may be any suitable system for fabricating a segmented design. In some embodiments, the fabrication system 712 may be a photolithography system or an additive manufacturing system. In some embodiments, the fabrication system 712 may have characteristics that include a minimum feature size, a minimum feature shape, and/or other characteristics that help define the segmented designs that the fabrication system 712 is capable of fabricating.

In some embodiments, the design verification system 702 may be any suitable computing device or collection of computing devices configured to provide the described functionality. In some embodiments, the design verification system 702 may be a server computing device, a desktop computing device, a laptop computing device, a mobile computing device, a tablet computing device, or one or more computing devices of a cloud computing system.

As shown, the design verification system 702 includes at least one processor 706, a network interface 708, and a computer-readable medium 704. In some embodiments, the at least one processor 706 may include a plurality of processors and/or a plurality of processing cores in order to provide a large amount of computing power. In some embodiments, the network interface 708 may be configured to communicate with the design generation system 710 and/or the fabrication system 712 via any suitable type of wired network (including but not limited to Ethernet, FireWire, and USB), wireless network (including but not limited to 2G, 3G, 4G, 5G, LTE, Wi-Fi, WiMAX, and Bluetooth), or combinations thereof. In some embodiments, instead of a network interface 708, the design verification system 702 may be configured to communicate with the design generation system 710 and/or the fabrication system 712 via transfer of a removable computer-readable medium (not shown).

As shown, the computer-readable medium 704 has logic stored thereon for providing a paintbrush determination engine 714, a forbidden pattern determination engine 716, and a forbidden pattern search engine 718. In some embodiments, the paintbrush determination engine 714 is configured to determine one or more paintbrush patterns for a given fabrication system 712 based on various capabilities of the fabrication system 712. In some embodiments, the forbidden pattern determination engine 716 is configured to determine at least one set of forbidden patterns that cannot be fabricated by the fabrication system 712 based on the paintbrush pattern. In some embodiments, the forbidden pattern search engine 718 is configured to search for the forbidden patterns in at least one set of forbidden patterns within a proposed segmented design generated by the design generation system 710. Further description of the actions which these components are configured to perform is provided below.

"engine" refers to logic embodied in hardware or software instructions, which can be written in a programming language, such as C, C++, COBOL, JAVA™, PHP, Perl, HTML, CSS, JavaScript, VBScript, ASPX, Microsoft.NET™, Go, and/or the like. An engine may be compiled into executable programs or written in interpreted programming languages. Software engines may be callable from other engines or from themselves. Generally, the engines described herein refer to logical modules that can be merged with other engines, or can be divided into sub-engines. The engines can be stored in any type of computer-readable medium or computer storage device and be stored on and executed by one or more general purpose computers, thus creating a special purpose computer configured to provide the engine or the functionality thereof.

"computer-readable medium" refers to a removable or nonremovable device that implements any technology capable of storing information in a volatile or non-volatile manner to be read by a processor of a computing device, including but not limited to: a hard drive; a flash memory; a solid state drive; random-access memory (RAM); read-only memory (ROM); a CD-ROM, a DVD, or other disk storage; a magnetic cassette; a magnetic tape; and a magnetic disk storage.

Figure 8:
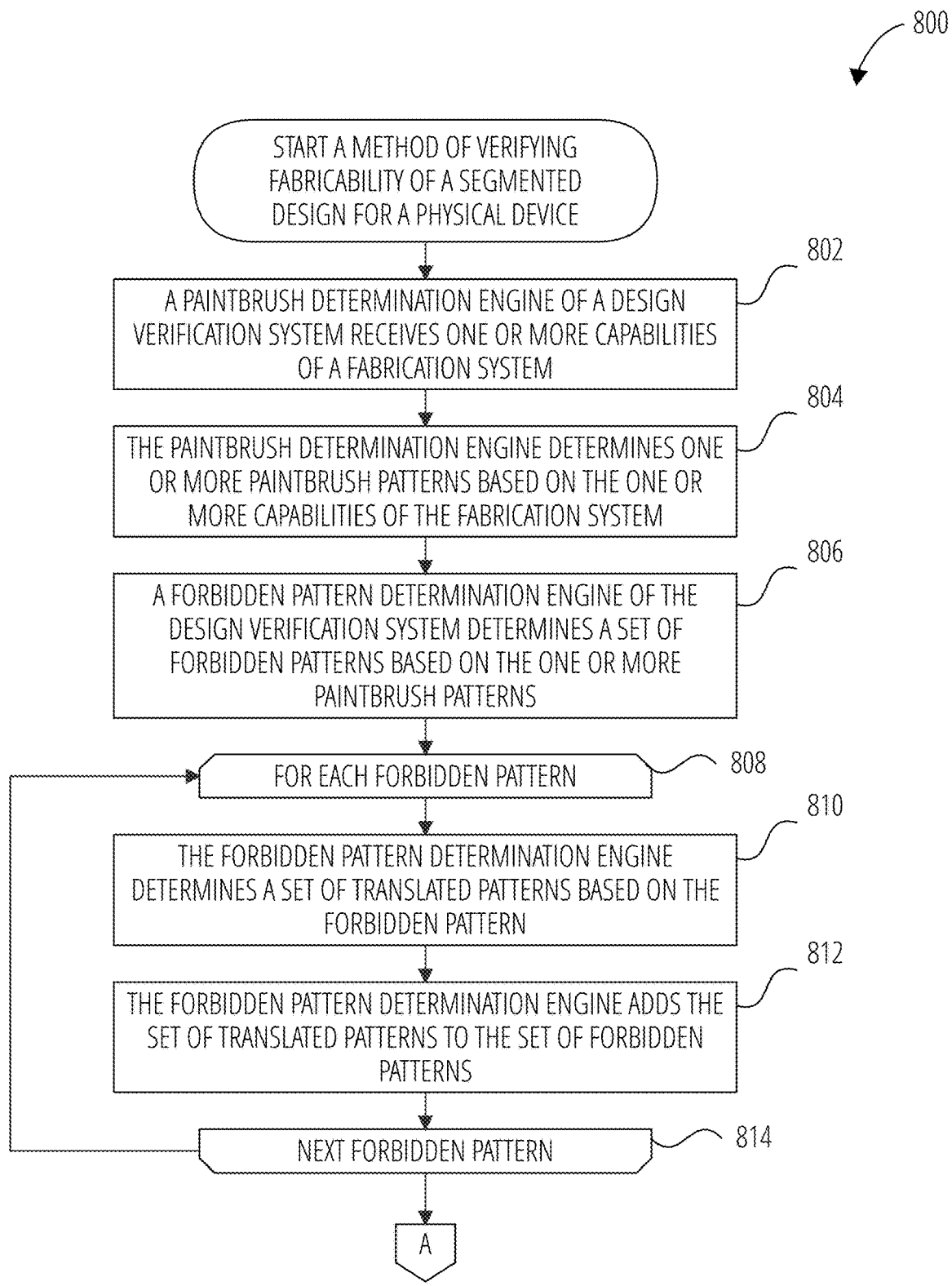
FIG. 8-FIG. 9 are a flowchart that illustrates a non-limiting example embodiment of a method of verifying fabricability of a segmented design for a physical device according to various aspects of the present disclosure.
Figure 9:
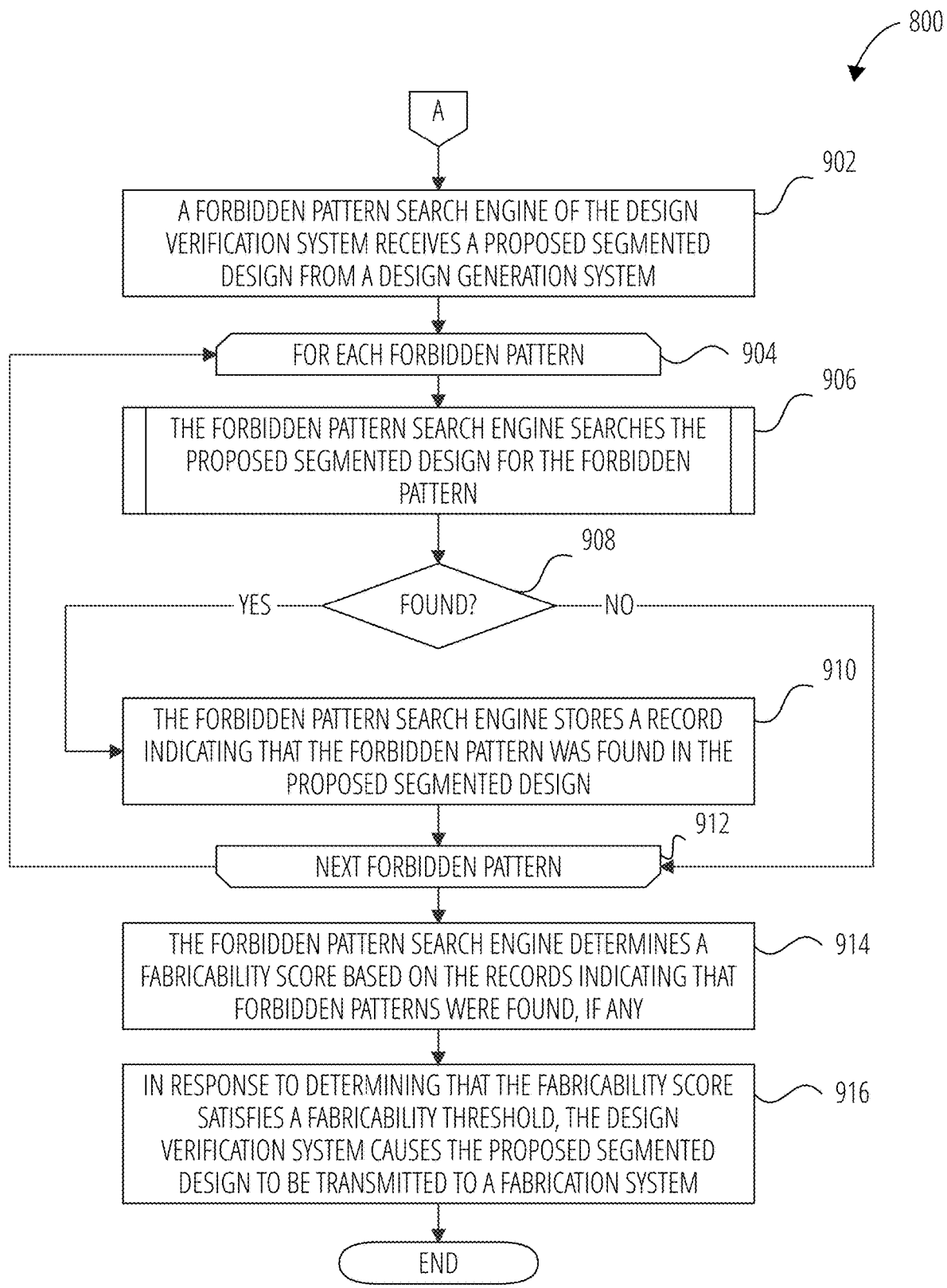

FIG. 8-FIG. 9 are a flowchart that illustrates a non-limiting example embodiment of a method of verifying fabricability of a segmented design for a physical device according to various aspects of the present disclosure. In some embodiments, the physical device may be an electromagnetic device as described above. In some embodiments, the physical device may be any other type of device fabricable from a segmented design.

From a start block, the method 800 proceeds to block 802, where a paintbrush determination engine 714 of a design verification system 702 receives one or more capabilities of a fabrication system 712. The capabilities may include information regarding how the fabrication system 712 operates, and/or what types of patterns the fabrication system 712 is capable of producing. A minimum feature size and a minimum feature shape are non-limiting examples of capabilities that may be received, though in some embodiments, additional or different capabilities may be received.

At block 804, the paintbrush determination engine 714 determines one or more paintbrush patterns based on the one or more capabilities of the fabrication system 712. In some embodiments, the paintbrush determination engine 714 may directly calculate the paintbrush patterns based on the capabilities. For example, if the capabilities include a minimum feature size and a minimum feature shape, the paintbrush determination engine 714 may determine a paintbrush pattern made up of segments that represent these capabilities. That is, if the minimum feature size is 10 nm, and the minimum feature shape is square, then the paintbrush determination engine 714 may determine a paintbrush pattern that is made up of segments that define a 10 nm by 10 nm square. In some embodiments, the paintbrush determination engine 714 may determine the paintbrush patterns by receiving a specification of the paintbrush patterns from another source, including but not limited to being manually specified by a user.

At block 806, a forbidden pattern determination engine 716 of the design verification system 702 determines a set of forbidden patterns based on the one or more paintbrush patterns. In some embodiments, the forbidden pattern determination engine 716 may automatically determine the set of forbidden patterns based on the paintbrush patterns. In some embodiments, the forbidden pattern determination engine 716 may receive the set of forbidden patterns from another source, including but not limited to being manually specified by a user or being retrieved from a database.

Figure 10:
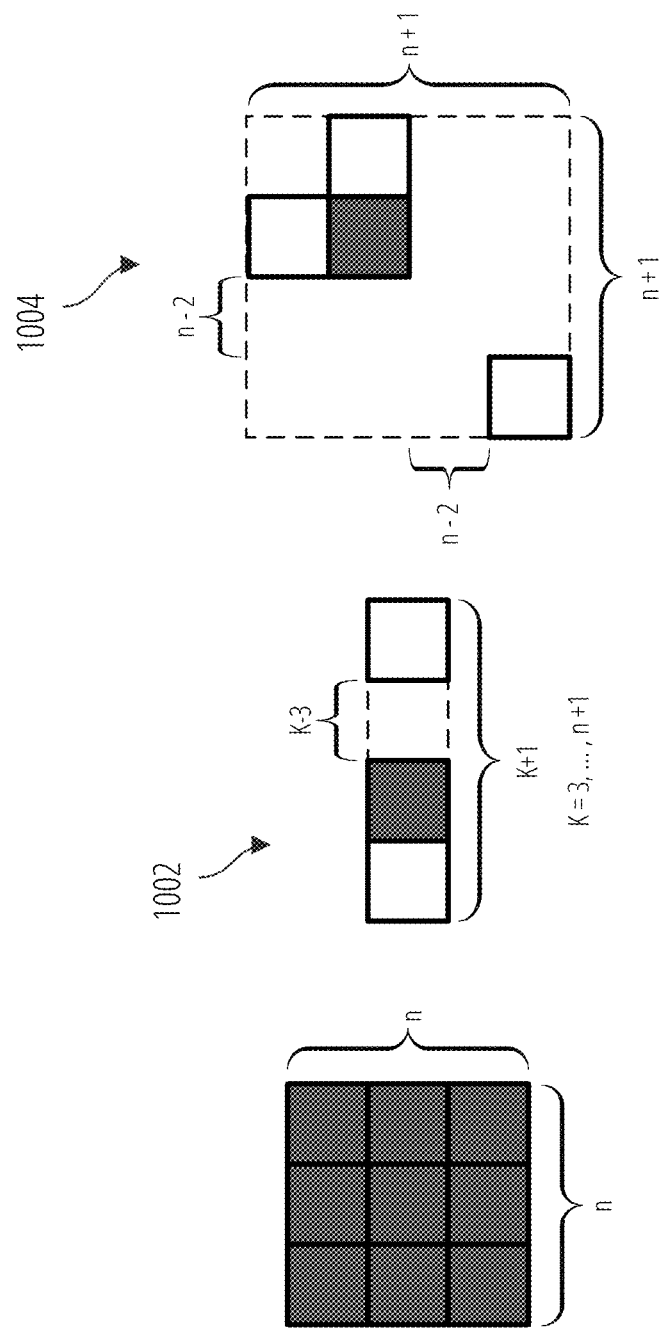
FIG. 10 illustrates a set of base patterns for automatically determining a set of forbidden patterns for an N×N paintbrush pattern according to various aspects of the present disclosure.

For some common shapes of paintbrush patterns, automatic determination of the set of forbidden patterns can be performed based on a simple set of base patterns. FIG. 10 illustrates a set of base patterns for automatically determining a set of forbidden patterns for an N×N paintbrush pattern according to various aspects of the present disclosure. A first base pattern 1002 is K segments wide and one segment tall, and has a first white segment, a second dark segment, a set of K−3 segments of any color, and a final white segment. The complete set of base patterns includes a first base pattern 1002 for each value of K between 3 and N+1. So, for example, for the 2×2 paintbrush pattern 402 illustrated in FIG. 4, a single forbidden pattern where K=3 is generated (first forbidden pattern 404). As another example, for the 3×3 paintbrush pattern 502 illustrated in FIG. 5, a forbidden pattern where K=3 is generated (first forbidden pattern 504), and a forbidden pattern where K=4 is generated (second forbidden pattern 506). For N>3, this would continue, with each successive N including all of the patterns for the previous N, plus an additional pattern.

A second base pattern 1004 is N+1 segments square, and includes a single white segment in the lower left corner, and an "L" shape of two white segments connected by a single dark segment in the upper right corner. The upper right corner and the lower left corner are separated by N−2 segments. Accordingly, for the 2×2 paintbrush pattern 402 in FIG. 4, the second forbidden pattern 406 does not include any space between the lower left segment and the upper right segments, while the 3×3 paintbrush pattern 502 in FIG. 5 includes a single segment between the lower left segment and the upper right segments in the third forbidden pattern 508. This second base pattern 1004 can also be extended automatically for any N>3.

Figure 11:
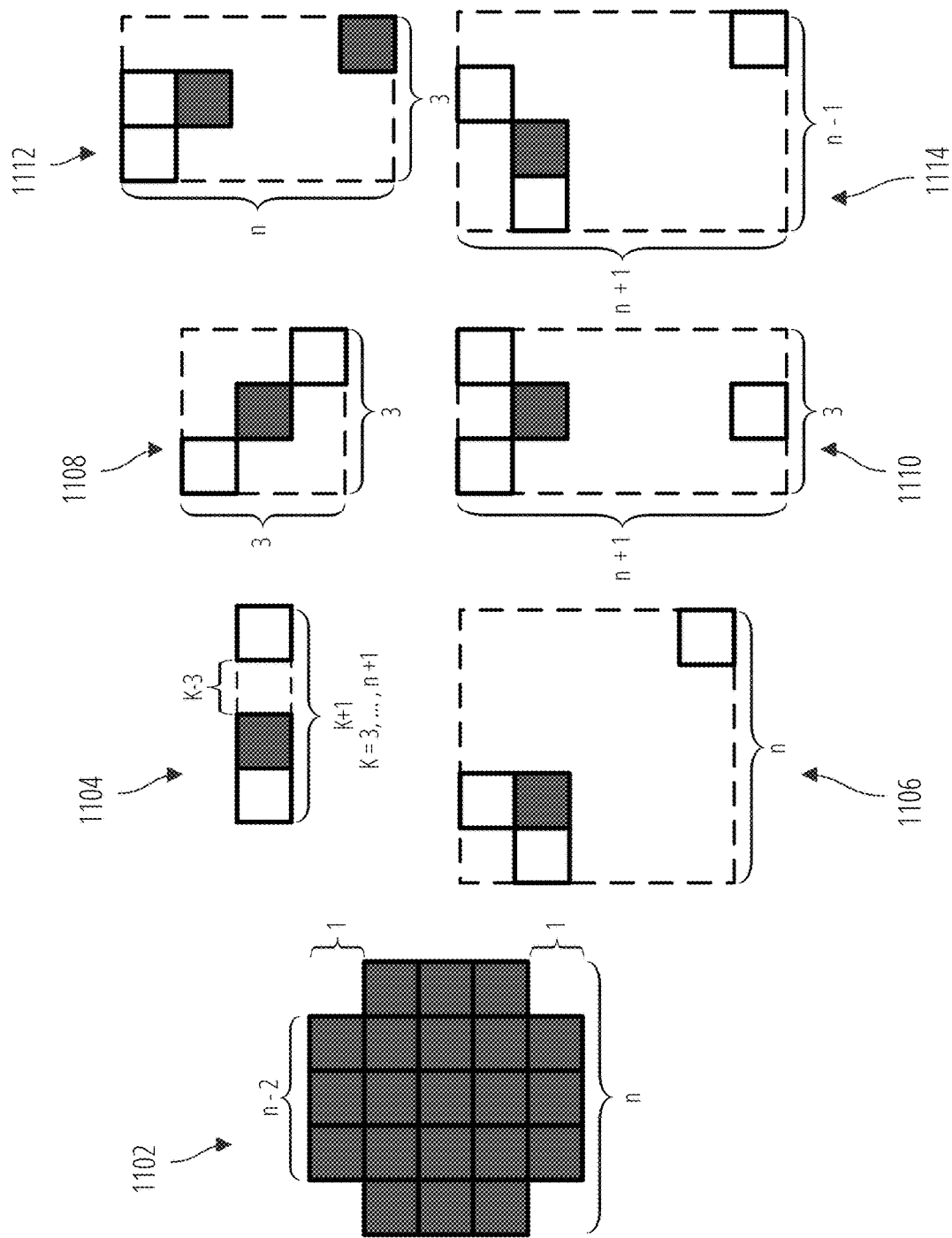
FIG. 11 illustrates a set of base patterns for automatically determining a set of forbidden patterns for an N×N paintbrush pattern having segments removed from the corners according to various aspects of the present disclosure.

FIG. 11 illustrates a set of base patterns for automatically determining a set of forbidden patterns for an N×N paintbrush pattern having segments removed from the corners according to various aspects of the present disclosure. Often, a fabrication system 712 may have constraints that cause the paintbrush patterns it can generate to not be square, but instead to have a pattern more similar to the paintbrush pattern 1102 illustrated in FIG. 11. A first base pattern 1104 and a second base pattern 1106 for the paintbrush pattern 1102 are similar to the first base pattern 1002 and the second base pattern 1004 illustrated in FIG. 10. Due to its greater complexity, however, the paintbrush pattern 1102 also includes a third base pattern 1108, a fourth base pattern 1110, a fifth base pattern 1112, and a sixth base pattern 1114 within its set of base patterns. Using these base patterns, a full set of forbidden patterns can be constructed for any N×N paintbrush pattern having single segments removed from the corners.

For other shapes of paintbrushes, other techniques may be used to determine the set of forbidden patterns. As one nonlimiting example of a technique, a single segment may be affixed as a point of reference, and the paintbrush pattern may be superimposed on this single segment such that each segment in the paintbrush pattern is placed on the single segment. The total area covered by the superimposed paintbrush patterns may be referred to as a "shadow." Keeping the single segment a fixed color, each combination of colors in the other segments of the shadow may be tested to determine whether there are combinations that cannot be painted by the paintbrush pattern. Each such combination may be determined to be a forbidden pattern.

Returning to FIG. 8, in some embodiments, an initial set of forbidden patterns generated by the forbidden pattern determination engine 716 at block 806 only includes distinct patterns, such as the first forbidden pattern 504, 506, and third forbidden pattern 508 illustrated in FIG. 5. This initial set of forbidden patterns is then augmented by the forbidden pattern determination engine 716 through one or more transformations to include all possible forbidden patterns. Accordingly, the method 800 proceeds to a for-loop defined between a for-loop start block 808 and a for-loop end block 814, wherein each forbidden pattern of the set of forbidden patterns is processed to augment the overall set of forbidden patterns with translated versions of each forbidden pattern.

From the for-loop start block 808, the method 800 proceeds to block 810, where the forbidden pattern determination engine 716 determines a set of translated patterns based on the forbidden pattern. In some embodiments, to determine the set of translated patterns, the forbidden pattern determination engine 716 rotates the forbidden pattern to other orientations and/or flips the forbidden pattern along one or more axes. For example, if the segmented design is two-dimensional and based on square segments, the forbidden pattern may be rotated 90 degrees, 180 degrees, and 270 degrees, and/or may be flipped along a vertical axis and a horizontal axis. As another example, if the segmented design is two-dimensional and based on hexagonal segments, then the forbidden pattern may be rotated in 60 degree increments, and/or may be flipped along one or more of three axes. As yet another example, if the segmented design is three-dimensional and based on cubic segments, then the forbidden pattern may be rotated in 90-degree increments along each axis, and may be flipped along each axis.

At block 812, the forbidden pattern determination engine 716 adds the set of translated patterns to the set of forbidden patterns. In some embodiments, the forbidden pattern determination engine 716 adds the set of translated patterns in such a way that the set of translated patterns are not added to the forbidden patterns that are processed in the for-loop 908-914.

The method 800 then proceeds to the for-loop end block 814. If more forbidden patterns remain to be processed in the set of forbidden patterns, then the method 800 returns to the for-loop start block 808 to process the next forbidden pattern. Otherwise, if all of the forbidden patterns in the set of forbidden patterns have been processed, then the method 800 proceeds from the for-loop end block 814 to a continuation terminal ("terminal A").

From terminal A (FIG. 9), the method 800 proceeds to block 902, where a forbidden pattern search engine 718 of the design verification system 702 receives a proposed segmented design from a design generation system 710. The design generation system 710 may generate the proposed segmented design using any automated or manual technique.

The method 800 then proceeds to a for-loop defined between a for-loop start block 904 and a for-loop end block 912, wherein the proposed segmented design is searched for each forbidden pattern of the set of forbidden patterns. From the for-loop start block 904, the method 800 proceeds to subroutine block 906, where a procedure is executed wherein the forbidden pattern search engine 718 searches the proposed segmented design for the forbidden pattern.

Figure 12:
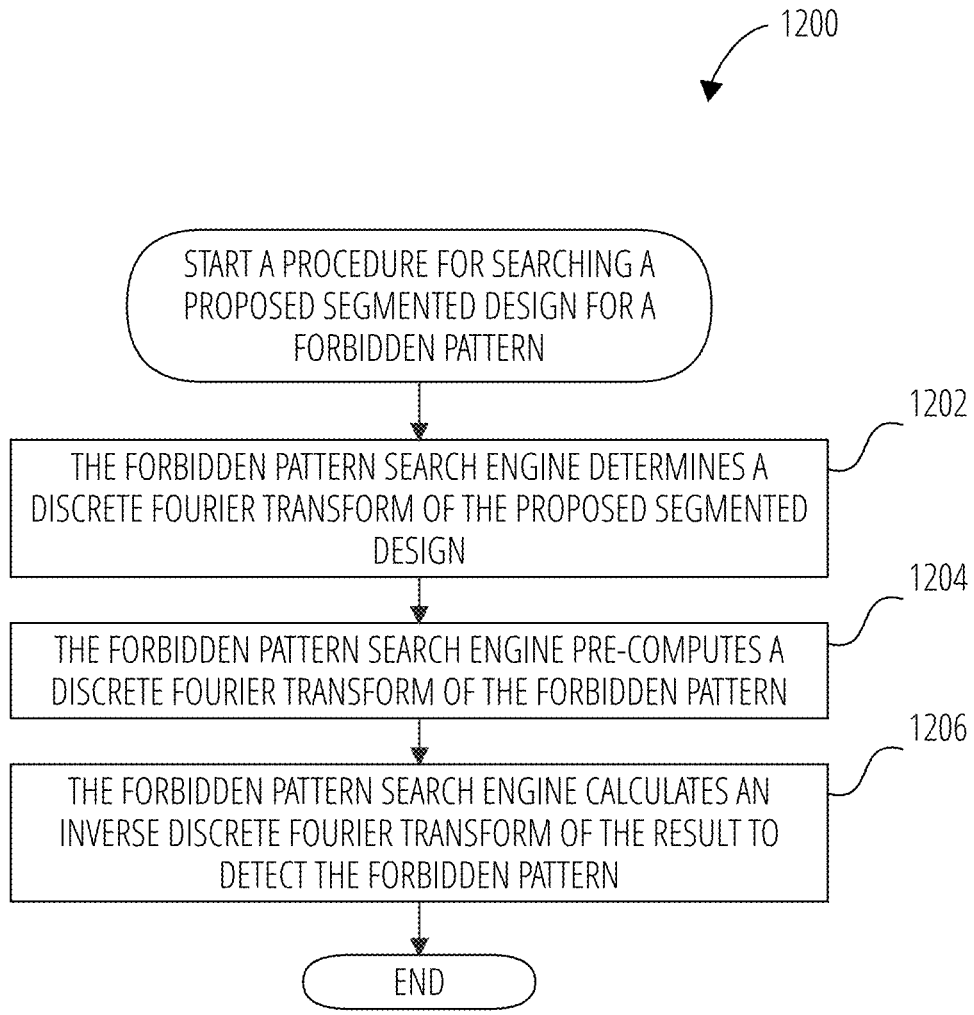
FIG. 12 is a flowchart that illustrates a non-limiting example embodiment of a procedure for searching a proposed segmented design for a forbidden pattern according to various aspects of the present disclosure.

Any suitable technique may be used to search for the forbidden patterns. While searching for forbidden patterns (instead of attempting to find a tiling of the paintbrush pattern that covers the proposed segmented design) is itself a significant improvement in efficiency, the choice of technique for searching for the forbidden patterns can greatly influence the efficiency gained. In some embodiments, a cross-correlation may be computed of the forbidden pattern versus the proposed segmented design to determine whether the forbidden pattern is present. While simple, this technique requires a large number of computations. In some embodiments, a discrete Fourier transform may be used to greatly enhance the efficiency of the search. A procedure that utilizes a discrete Fourier transform for the search is illustrated in FIG. 12 and described in further detail below.

At decision block 908, a determination is made regarding whether the forbidden pattern was found in the proposed segmented design. If the forbidden pattern was not found, then the result of decision block 908 is NO, and the method 800 proceeds to the for-loop end block 912. Otherwise, if the forbidden pattern was found, then the result of decision block 908 is YES, and the method 800 proceeds to block 910.

At block 910, the forbidden pattern search engine 718 stores a record indicating that the forbidden pattern was found in the proposed segmented design. In some embodiments, the procedure executed in subroutine block 906 may return a Boolean value indicating whether or not the forbidden pattern was found, and the record may simply track the Boolean value. In some embodiments, the procedure executed in subroutine block 906 may report one or more segments which were found to be associated with the forbidden pattern. In these embodiments, the record may indicate the segments which were associated with the forbidden pattern. The method 800 then proceeds to the for-loop end block 912.

At the for-loop end block 912, a determination is made regarding whether there are further forbidden patterns in the set of forbidden patterns to process. If so, then the method 800 returns to the for-loop start block 904 to process the next forbidden pattern. Otherwise, if all of the forbidden patterns have been processed, then the method 800 proceeds from the for-loop end block 912 to block 914.

At block 914, the forbidden pattern search engine 718 determines a fabricability score based on the records indicating that forbidden patterns were found, if any. In some embodiments, the fabricability score may represent a number or percentage of segments that are associated with at least one forbidden pattern, or a number or percentage of forbidden patterns that are present in the proposed segmented design, in order to quantify how for the proposed segmented design is from being fabricable. In some embodiments, the fabricability score may be a Boolean value that represents whether or not the proposed segmented design is fabricable. In some embodiments, the presence of any single forbidden pattern in the proposed segmented design will mean that the entire proposed segmented design is not fabricable.

At block 916, in response to determining that the fabricability score satisfies a fabricability threshold, the design verification system 702 causes the proposed segmented design to be transmitted to a fabrication system 712. In some embodiments, the fabricability threshold may require that the fabricability score indicates that no forbidden patterns were found in the proposed segmented design. Block 916, as illustrated, assumes that the fabricability score satisfies the fabricability threshold. If the fabricability score does not satisfy the fabricability threshold, then the method 800 may present an alert or message indicating that the proposed segmented design is not fabricable, or may otherwise reject the proposed segmented design.

The method 800 then proceeds to an end block and terminates.

FIG. 12 is a flowchart that illustrates a non-limiting example embodiment of a procedure for searching a proposed segmented design for a forbidden pattern according to various aspects of the present disclosure. The procedure 1200 is an example of a procedure suitable for use at subroutine block 906 of FIG. 9. By using a discrete Fourier transform, the procedure 1200 can reduce the computing time needed for searching the proposed segmented design for the forbidden pattern by at least an order of magnitude.

From a start block, the procedure 1200 advances to block 1202, where the forbidden pattern search engine 718 determines a discrete Fourier transform of the proposed segmented design. At block 1204, the forbidden pattern search engine 718 pre-computes a discrete Fourier transform of the forbidden pattern. At block 1206, the forbidden pattern search engine 718 calculates an inverse discrete Fourier transform of the result to detect the forbidden pattern.

The procedure 1200 then advances to an end block and terminates, returning a result of the processing to a caller.

In the procedure 1200, any suitable discrete Fourier transform technique may be used. In some embodiments, a real-valued discrete Fourier transform may be used. In some embodiments, a more specialized discrete Fourier transform technique may be used. For example, a number theoretic transform may be used instead of a real-valued discrete Fourier transform. The number theoretic transform is not as exact as the real-valued discrete Fourier transform, thus avoiding numerical issues. The number theoretic transform also uses fewer bits than the real-valued discrete Fourier transform.

Figure 13:
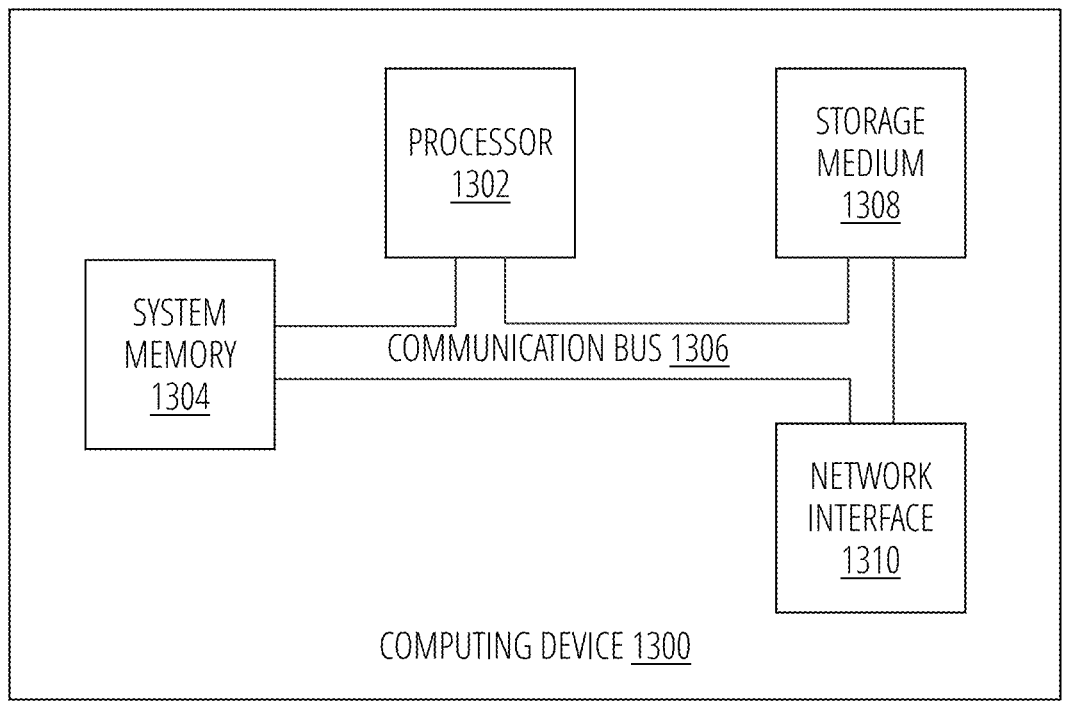
FIG. 13 is a block diagram that illustrates a non-limiting example embodiment of a computing device appropriate for use as a computing device with embodiments of the present disclosure.

FIG. 13 is a block diagram that illustrates aspects of an exemplary computing device 1300 appropriate for use as a computing device of the present disclosure. While multiple different types of computing devices were discussed above, the exemplary computing device 1300 describes various elements that are common to many different types of computing devices. While FIG. 13 is described with reference to a computing device that is implemented as a device on a network, the description below is applicable to servers, personal computers, mobile phones, smart phones, tablet computers, embedded computing devices, and other devices that may be used to implement portions of embodiments of the present disclosure. Moreover, those of ordinary skill in the art and others will recognize that the computing device 1300 may be any one of any number of currently available or yet to be developed devices.

In its most basic configuration, the computing device 1300 includes at least one processor 1302 and a system memory 1304 connected by a communication bus 1306. Depending on the exact configuration and type of device, the system memory 1304 may be volatile or nonvolatile memory, such as read only memory ("ROM"), random access memory ("RAM"), EEPROM, flash memory, or similar memory technology. Those of ordinary skill in the art and others will recognize that system memory 1304 typically stores data and/or program modules that are immediately accessible to and/or currently being operated on by the processor 1302. In this regard, the processor 1302 may serve as a computational center of the computing device 1300 by supporting the execution of instructions.

As further illustrated in FIG. 13, the computing device 1300 may include a network interface 1310 comprising one or more components for communicating with other devices over a network. Embodiments of the present disclosure may access basic services that utilize the network interface 1310 to perform communications using common network protocols. The network interface 1310 may also include a wireless network interface configured to communicate via one or more wireless communication protocols, such as WiFi, 2G, 3G, LTE, WiMAX, Bluetooth, Bluetooth low energy, and/or the like. As will be appreciated by one of ordinary skill in the art, the network interface 1310 illustrated in FIG. 13 may represent one or more wireless interfaces or physical communication interfaces described and illustrated above with respect to particular components of the computing device 1300.

In the exemplary embodiment depicted in FIG. 13, the computing device 1300 also includes a storage medium 1308. However, services may be accessed using a computing device that does not include means for persisting data to a local storage medium. Therefore, the storage medium 1308 depicted in FIG. 13 is represented with a dashed line to indicate that the storage medium 1308 is optional. In any event, the storage medium 1308 may be volatile or nonvolatile, removable or nonremovable, implemented using any technology capable of storing information such as, but not limited to, a hard drive, solid state drive, CD ROM, DVD, or other disk storage, magnetic cassettes, magnetic tape, magnetic disk storage, and/or the like.

As used herein, the term "computer-readable medium" includes volatile and non-volatile and removable and non-removable media implemented in any method or technology capable of storing information, such as computer readable instructions, data structures, program modules, or other data. In this regard, the system memory 1304 and storage medium 1308 depicted in FIG. 13 are merely examples of computer-readable media.

Suitable implementations of computing devices that include a processor 1302, system memory 1304, communication bus 1306, storage medium 1308, and network interface 1310 are known and commercially available. For ease of illustration and because it is not important for an understanding of the claimed subject matter, FIG. 13 does not show some of the typical components of many computing devices. In this regard, the computing device 1300 may include input devices, such as a keyboard, keypad, mouse, microphone, touch input device, touch screen, tablet, and/or the like. Such input devices may be coupled to the computing device 1300 by wired or wireless connections including RF, infrared, serial, parallel, Bluetooth, Bluetooth low energy, USB, or other suitable connections protocols using wireless or physical connections. Similarly, the computing device 1300 may also include output devices such as a display, speakers, printer, etc. Since these devices are well known in the art, they are not illustrated or described further herein.

In the foregoing description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The order in which some or all of the process blocks appear in each process should not be deemed limiting. Rather, one of ordinary skill in the art having the benefit of the present disclosure will understand that some of the process blocks may be executed in a variety of orders not illustrated, or even in parallel.

The above description of illustrated embodiments, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of verifying fabricability of a segmented design for a physical device to be fabricated by a fabrication system, the method comprising:
    determining a paintbrush pattern that represents a fabricable pattern of segments according to capabilities of the fabrication system;
    using the paintbrush pattern to determine a set of forbidden patterns, wherein each forbidden pattern in the set of forbidden patterns indicates a pattern of segments that cannot be drawn with the paintbrush pattern;
    receiving a proposed segmented design;
    searching the proposed segmented design for the forbidden patterns of the set of forbidden patterns; and
    determining the fabricability of the proposed segmented design based on results of the searching for the forbidden patterns.

2. The method of claim 1, wherein the proposed segmented design is a two-dimensional design segmented into pixels, or a three-dimensional design segmented into voxels.

3. The method of claim 1, wherein the capabilities include at least one of a minimum feature size and a minimum feature shape.

4. The method of claim 1, wherein using the paintbrush pattern to determine the set of forbidden patterns includes:
    determining a first forbidden pattern based on the paintbrush pattern;
    adding the first forbidden pattern to the set of forbidden patterns;
    determining a set of translated patterns by at least rotating and flipping the first forbidden pattern; and
    adding the set of translated patterns to the set of forbidden patterns.

5. The method of claim 1, wherein searching the proposed segmented design for forbidden patterns for the set of forbidden patterns includes, for each forbidden pattern in the set of forbidden patterns, computing a cross-correlation between the forbidden pattern and the proposed segmented design.

6. The method of claim 1, wherein searching the proposed segmented design for forbidden patterns for the set of forbidden patterns includes, for each forbidden pattern in the set of forbidden patterns:
    determining a discrete Fourier transform of the proposed segmented design;
    pre-computing a discrete Fourier transform of the forbidden pattern; and
    calculating an inverse discrete Fourier transform of the result to detect the forbidden patterns.

7. The method of claim 6, wherein the discrete Fourier transform is a number theoretic transform.

8. The method of claim 1, further comprising, in response to determining that the proposed segmented design is fabricable, providing the segmented design to the fabrication system to manufacture the physical device.

9. The method of claim 8, wherein providing the segmented design to the fabrication system to manufacture the physical device includes providing the segmented design to a photolithography system.

10. A non-transitory computer-readable storage medium having instructions stored thereon that, in response to execution by one or more processors of a computing system, cause the computing system to perform actions for verifying fabricability of a segmented design for a physical device to be fabricated by a fabrication system, the actions comprising:
    determining a paintbrush pattern that represents a fabricable pattern of segments according to capabilities of the fabrication system;
    using the paintbrush pattern to determine a set of forbidden patterns, wherein each forbidden pattern in the set of forbidden patterns indicates a pattern of segments that cannot be drawn with the paintbrush pattern;
    receiving a proposed segmented design;
    searching the proposed segmented design for the forbidden patterns of the set of forbidden patterns; and
    determining the fabricability of the proposed segmented design based on results of the searching for the forbidden patterns.

11. The computer-readable storage medium of claim 10, wherein the proposed segmented design is a two-dimensional design segmented into pixels, or a three-dimensional design segmented into voxels.

12. The computer-readable storage medium of claim 10, wherein the capabilities include at least one of a minimum feature size and a minimum feature shape.

13. The computer-readable storage medium of claim 10, wherein using the paintbrush pattern to determine the set of forbidden patterns includes:
    determining a first forbidden pattern based on the paintbrush pattern;
    adding the first forbidden pattern to the set of forbidden patterns;
    determining a set of translated patterns by at least rotating and flipping the first forbidden pattern; and
    adding the set of translated patterns to the set of forbidden patterns.

14. The computer-readable storage medium of claim 10, wherein searching the proposed segmented design for forbidden patterns for the set of forbidden patterns includes, for each forbidden pattern in the set of forbidden patterns, computing a cross-correlation between the forbidden pattern and the proposed segmented design.

15. The computer-readable storage medium of claim 10, wherein searching the proposed segmented design for forbidden patterns for the set of forbidden patterns includes, for each forbidden pattern in the set of forbidden patterns:
    determining a discrete Fourier transform of the proposed segmented design;

pre-computing a discrete Fourier transform of the forbidden pattern; and calculating an inverse discrete Fourier transform of the result to detect the forbidden patterns.

16. The computer-readable storage medium of claim 15, wherein the discrete Fourier transform is a number theoretic transform.

17. The computer-readable storage medium of claim 10, wherein the actions further comprise, in response to determining that the proposed segmented design is fabricable, providing the segmented design to the fabrication system to manufacture the physical device.

18. The computer-readable storage medium of claim 17, wherein providing the segmented design to the fabrication system to manufacture the physical device includes providing the segmented design to a photolithography system.

\* \* \* \* \*